(12) United States Patent
Potasek et al.

(10) Patent No.: US 9,783,411 B1
(45) Date of Patent: Oct. 10, 2017

(54) ALL SILICON CAPACITIVE PRESSURE SENSOR

(71) Applicant: Rosemount Aerospace Inc., Burnsville, MN (US)

(72) Inventors: David P. Potasek, Lakeville, MN (US); Sean Houlihan, Minneapolis, MN (US)

(73) Assignee: Rosemount Aerospace Inc., Burnsville, MN (US)

(*) Notice: Subject to any disclaimer, the term of this patent is extended or adjusted under 35 U.S.C. 154(b) by 0 days.

(21) Appl. No.: 15/349,607

(22) Filed: Nov. 11, 2016

(51) Int. Cl.
*H01L 29/49* (2006.01)
*B81B 3/00* (2006.01)
*B81C 1/00* (2006.01)

(52) U.S. Cl.
CPC ........ *B81B 3/0086* (2013.01); *B81C 1/00269* (2013.01); *B81B 2201/0264* (2013.01); *B81B 2207/07* (2013.01); *B81C 2201/013* (2013.01)

(58) Field of Classification Search
CPC ................ B81B 3/0086; B81B 1/00269
See application file for complete search history.

(56) References Cited

U.S. PATENT DOCUMENTS 4,701,826 A  10/1987  Mikkor

FOREIGN PATENT DOCUMENTS

| CN | 202420729 U | 5/2012 |
| CN | 103196613 B | 2/2016 |
| JP | 2014071052 A | 4/2014 |

*Primary Examiner* — Michael Shingleton
(74) *Attorney, Agent, or Firm* — Kinney & Lange, P.A.

(57) ABSTRACT

A configuration for a capacitive pressure sensor uses a silicon on insulator wafer to create an electrically isolated sensing node across a gap from a pressure sensing wafer. The electrical isolation, small area of the gap, and silicon material throughout the capacitive pressure sensor allow for minimal parasitic capacitance and avoid problems associated with thermal mismatch.

20 Claims, 6 Drawing Sheets

ALL SILICON CAPACITIVE PRESSURE SENSOR

BACKGROUND

Microelectromechanical systems (MEMS) are small devices made of electrical and mechanical components, designed to work together to sense physical properties in their local environment. For instance, MEMS pressure sensors are designed to sense and report the pressure of a fluid or environment in which the pressure sensor resides. MEMS pressure sensors can be capacitive pressure sensors.

Capacitive pressure sensors are made of two electrodes separated by a gap. When pressure is applied to a pressure diaphragm, the diaphragm deforms and the gap changes, allowing the pressure sensor to detect the pressure change. The two electrodes must be electrically separated for the capacitive pressure sensor to work.

Traditional capacitive pressure sensors use two wafers made of different materials for the electrode assembly, typically silicon for the diaphragm electrode wafer, and an insulator, such as glass, for the second electrode wafer. The glass electrode wafer is metalized to provide a conductive path for the second electrode. However, these types of capacitive pressure sensors result in thermal mismatch between the glass electrode wafer and the silicon electrode wafer it is attached to. Moreover, glass tends to move or creep, creating thermal hysteresis effects in devices. These characteristics cause errors which reduce the accuracy of the pressure sensor.

Other capacitive pressure sensors use an all silicon second electrode by using a silicon on insulator ("SOI") wafer. In this type of arrangement, the second electrode is silicon separated from the first electrode by a thin dielectric layer, typically an oxide. While this arrangement avoids some of the pitfalls of a glass electrode, it has large parasitic capacitance, resulting in signal dilution. This occurs due to both the high permittivity of oxides and large bond area between the wafers. Additionally, the structure of diaphragm based capacitive pressure sensors results in the maximum gap deflection on only the small central portion of the diaphragm. This small area between the first and second electrode is the only useful area for measuring pressure, the rest of the area contributes to the parasitic capacitance.

Ideally, a capacitive pressure sensor design should avoid thermal mismatch between materials and minimize parasitic capacitance.

SUMMARY

A capacitive pressure sensor includes a backing wafer; a sensing wafer comprising: a support portion bonded to the backing wafer, and a sensing portion, the sensing portion configured to detect pressure; an electrode assembly comprising: a first silicon layer comprising: an attachment portion bonded to the sensing wafer; and a sensing node, the sensing node centered over the sensing portion of the sensing wafer, wherein the sensing node is isolated from the sensing portion of the sensing wafer by a gap, and wherein the sensing node is isolated from the attachment portion of the first silicon layer by a separation area; an insulating layer bonded to the first silicon layer opposite the sensing wafer; and a second silicon layer bonded to the insulating layer opposite the first silicon layer, the second silicon layer comprising: a first electrical contact electrically connected with the sensing wafer; and a second electrical contact electrically connected with the sensing node.

A method of making a capacitive pressure sensor includes depositing a nitride layer on a silicon on insulator wafer; etching a sensing node on a first side of the silicon on insulator wafer; etching primary and secondary cavities on a second side of the silicon on insulator wafer opposite the first side; selectively removing the protective nitride layer; bonding a sensing wafer to the first side of the silicon on insulator wafer opposite the second side; bonding a backing wafer to the sensing wafer opposite the silicon on insulator wafer; and depositing metal onto the primary cavities.

DETAILED DESCRIPTION

An all silicon capacitive pressure sensor can solve both thermal mismatch issues and high parasitic capacitance problems presented in prior art capacitive pressure sensor designs. An electrically isolated silicon sensing node acting as one half of the capacitor allows for these benefits. The silicon sensing node is electrically isolated from both conductive and capacitive losses.

Figure 1A:
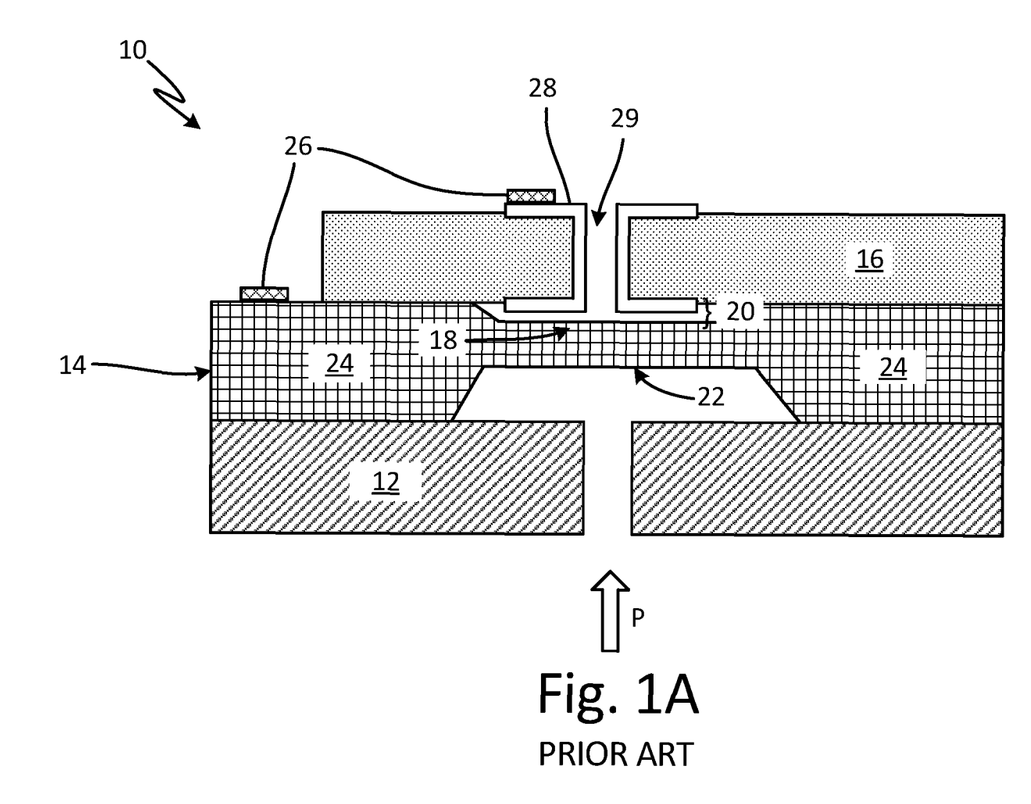
FIG. 1A is a schematic diagram of a glass electrode capacitive pressure sensor as found in prior art.

FIG. 1A is a schematic diagram of one example of capacitive pressure sensor 10 found in the prior art. Capacitive pressure sensor 10 includes backing wafer 12, sensing wafer 14, glass electrode wafer 16, silicon electrode 18, and gap 20. Backing wafer 12 is bonded to sensing wafer 14, and sensing wafer 14 is bonded to glass electrode wafer 16. Gap 20 is present between electrodes 16 and 18. Glass electrode 16 contains metallization 28. Metallization 28 is continuous through via 29 to bring electrical connection of electrode gap 20 to the top surface.

Backing wafer 12 and sensing wafer 14 are made of silicon. Backing wafer 12 is designed to anchor and protect sensing wafer 14. Silicon electrode 18 is attached to sensing wafer 14. Silicon electrode 18 can be a highly doped conductive region in sensing wafer 14, or alternately all of sensing wafer 14 can be highly doped and considered conductive. Sensing wafer 14 contains central diaphragm portion 22 and outer support portion 24. Diaphragm portion 22 of sensing wafer 14 is aligned with metallization via 29.

Metallization via 29 provides a path for glass electrode metallization 28 to connect the gap region 20 with top surface of glass electrode wafer 16. Diaphragm portion 22 of sensing wafer 14 deflects with pressure (represented by arrow P) from an external environment, but is protected from the external environment by backing wafer 12. When diaphragm portion 22 of sensing wafer 14 deflects, it effects gap 20.

The change in gap 20 is detected by electrodes 16 and 18, which are facing each other. Electrode 16 is made of glass or another insulator, and is attached directly to silicon sensing wafer 14. Thus, the bond between glass electrode wafer 16 and silicon sensing wafer 14 is subject to thermal mismatch, which can cause significant stress on pressure sensor 10. Additionally, glass, due to its amorphous structure, has a tendency to move or "creep" when subjected to varying temperature and pressure conditions. This causes the glass to change the distance of gap 20, the connection of glass electrode 16 to sensing wafer 14, or other constants in pressure sensor 10. Electrode 18 is more conductive, and is usually a doped region in semiconducting silicon. When diaphragm portion 22 deflects from incoming pressure, the distance between diaphragm portion 22 and glass electrode metallization 28 changes, resulting in a change of capacitance. The change in capacitance between the electrodes 16 and 18 allows pressure sensor 10 to detect pressure. However, the drawbacks of this set-up create unreliable pressure sensor data.

Figure 1B:
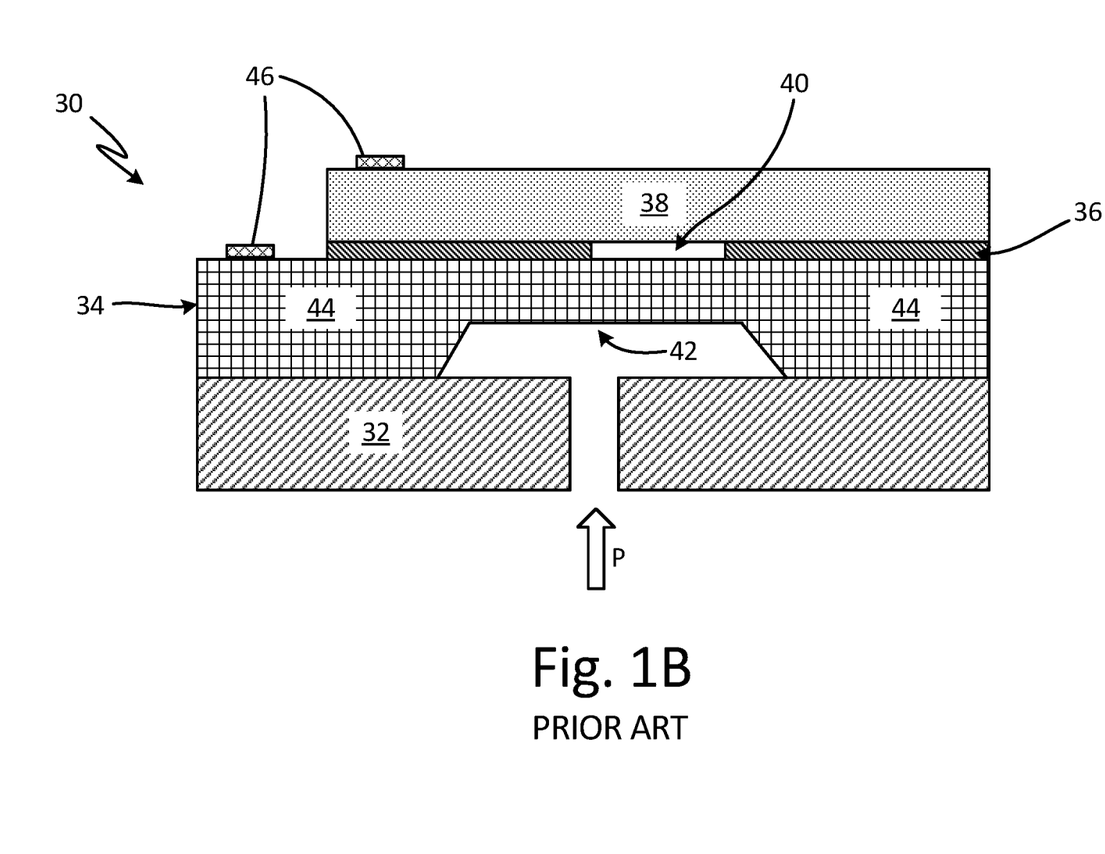
FIG. 1B is a schematic diagram of a simple silicon on insulator capacitive pressure sensor as found in prior art.

FIG. 1B is a schematic diagram of capacitive pressure sensor 30, another example found in the prior art. Capacitive pressure sensor 30 includes backing wafer 32, sensing wafer 34, oxide layer 36, silicon on insulator (SOI) electrode 38, and gap 40. Capacitive pressure sensor 30 is an alternative to capacitive pressure sensor 10 in FIG. 1A, both found in the prior art. In pressure sensor 30, backing wafer 32 is attached to sensing wafer 34, and SOI electrode 38 is bonded to sensing wafer 34 along oxide layer 36. Gap 40 is located between sensing wafer 34 and SOI electrode 38. Bond pads 46 allow for electrical connections to sensing wafer 34 and SOI electrode 34.

Backing wafer 32 and sensing wafer 34 are made of silicon. Backing wafer 32 is designed to anchor and protect sensing wafer 34. Sensing wafer 34 contains central diaphragm portion 42 and outer support portion 44. Diaphragm portion 42 of sensing wafer 34 is aligned with gap 40. Diaphragm portion 42 of sensing wafer 34 deflects with pressure from an external environment, but is protected from the external environment by backing wafer 32. When diaphragm portion 42 of sensing wafer 34 deflects, it affects gap 40.

The change in gap 40 between sensing wafer diaphragm 42 and SOI electrode 38 is reflective of pressure detected by diaphragm 42. However, SOI electrode 38 is very close to sensing wafer 34, which results in a large parasitic capacitance. Parasitic capacitance, or stray capacitance, is an unwanted capacitance that exists between electrical components. In pressure sensor 30, parasitic capacitance arises due to the thinness of oxide layer 36, which has high dielectric permittivity and is used to bond sensing wafer 34 to SOI electrode 38. In pressure sensor 30, the parasitic capacitance is so high that it can interfere with useful pressure signals. Additionally, the capacitance increases due to gap 40 being maintained along most of pressure sensor 30, but only a small portion of gap 40 is useful for detecting deflection of diaphragm 42.

Figure 2:
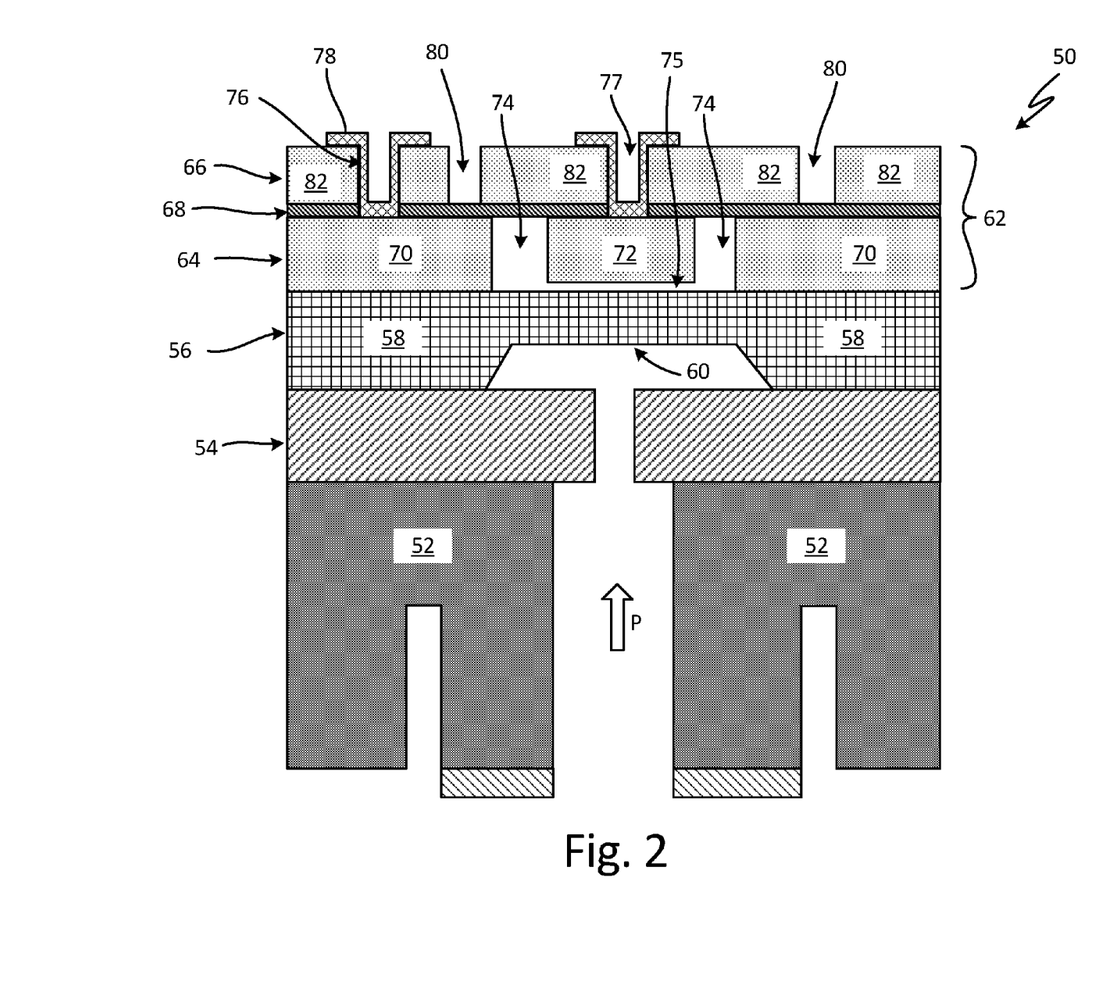
FIG. 2 is a schematic diagram of an all silicon capacitive pressure sensor.

FIG. 2 is a schematic diagram of all silicon capacitive pressure sensor 50, which eliminates thermal mismatch and minimizes parasitic capacitance common in prior art designs. Pressure sensor 50 includes base wafer 52, backing wafer 54, sensing wafer 56 (which includes support portion 58 and diaphragm 60), and electrode assembly 62. Electrode assembly 62 includes first silicon layer 64, second silicon layer 66, and dielectric layer 68. Within first silicon layer 64 are structural portions 70 and sensing node 72, separated by separation areas 74. Within second silicon layer 66 are electrical contacts 76, 77 (which include metallic layer 78) and isolation cavities 80 separated by structural portions 82.

Base wafer 52 serves as an anchor for pressure sensor 50, and is optional depending on the needs of pressure sensor 50 and the environment in which it rests. Base wafer 52 can be made of an insulator, such as glass, or other appropriate materials. Backing wafer 54 is anchored to base wafer 52. Backing wafer 54 is made of silicon. Both base wafer 52 and backing wafer 54 serve to protect sensing wafer 56 from the external environment. Base wafer 52 includes a passage through which fluid of interest can pass to backing wafer 54 and sensing wafer 56. Backing wafer 54 contains a small passage through which fluid can pass to sensing wafer 56, protecting sensing wafer 56 from harsh external environments. Base wafer 52 can also be used to anchor pressure sensor 50 in a housing (not pictured).

Sensing wafer 56 is also made of silicon, and is bonded to backing wafer 54. Sensing wafer includes support portion 58 and diaphragm 60. Support portion 58 stabilizes sensing wafer 56. Diaphragm 60 deflects based on incoming fluid pressure. Diaphragm 60 is aligned with sensing node 72 of electrode assembly 62 to create a capacitive pressure sensor. Gap 75 between diaphragm 60 and sensing node 72 changes when diaphragm 60 is deflected by pressure from a fluid of interest. Sensing wafer 56 is attached to electrode assembly 62, which includes sensing node 72.

Electrode assembly 62 is made of a silicon on insulator (SOI) material with two silicon layers 64, 66 and dielectric layer 68 (typically an oxide) between the first and second silicon layers. First layer 64 is attached directly to sensing wafer 56 through structural portions 70, which are bonded to support portions 58 of sensing wafer 56. First layer 64 also contains sensing node 72, also made of silicon. Sensing node 72 is centered in electrode assembly 62 over diaphragm 60 of sensing wafer 56. Sensing node 72 is electrically isolated from sensing wafer 56 and structural portions 58 by separation areas 74 and gap 75.

Separation areas 74 can be a vacuum or air insulation, depending on the needs of pressure sensor 50. If areas 74 are a vacuum, the setup eliminates a need for expensive vacuum packing later. Gap 75 lies between diaphragm 60 and node 72, and changes as diaphragm 60 is deflected. Node 72 detects the change in proximity of diaphragm 60 across the gap and sends a signal through second electrical connection 77, which is anchored in second layer 66 but runs through dielectric layer 68 to be in electrical contact with node 72. Similarly, first electrical connection 76 extends through dielectric layer 68 and is in electrical connection with structural portions 70 and sensing wafer 56.

Dielectric layer 68 is typically an oxide layer, and is electrically isolating. Dielectric layer 68 ensures node 72 is not electrically connected to diaphragm 60, and that electrical contacts 76 are only in contact with the proper sources of electrical signal. Second layer 66, isolated from first layer 64 by dielectric layer 68, and contains one or more electrical contacts 76, which are plated with a metal 78. Electrical contacts 76 are isolated from each other by isolation gaps 80 and from other parts of electrode assembly 62 by dielectric layer 68. First and second electrical contact 76, 77 run through dielectric layer 68 at certain areas to create electrical connections to either diaphragm 60 (contact 76) or sensing node 72 (contact 77). Electrical contacts 76, 77 can be connected to external electronics (not pictured).

The configuration of electrode assembly 62 allows for low parasitic capacitance across gap 75, as gap 75 is small, central, and isolated by areas 74. In particular, a small bond area between structural portions 70 and 82 (where support portions 82 overlap with sensing node 72) minimizes the contribution of parasitic capacitance due to that area. Generally, the bond length between structural portions 70 and 82 is no greater than ten times the length of gap 75. Additionally, the width of isolation cavities 80, and the width of separation areas 74 is greater than five times the width of gap 75. This reduces parasitic capacitance contributed by isolation cavities 80 and separation areas 74.

Overall, parasitic capacitance due to dielectric layer 68 can be less than 10% of the base capacitance, which is minimal compared to arrangement found in the prior art. But the configuration of electrode assembly 62 also allows for a reduction in thermal mismatch, because structural portions 70 and support portions 58, which attach sensing wafer 56 to electrode assembly 62, are all made of silicon.

Figure 3:
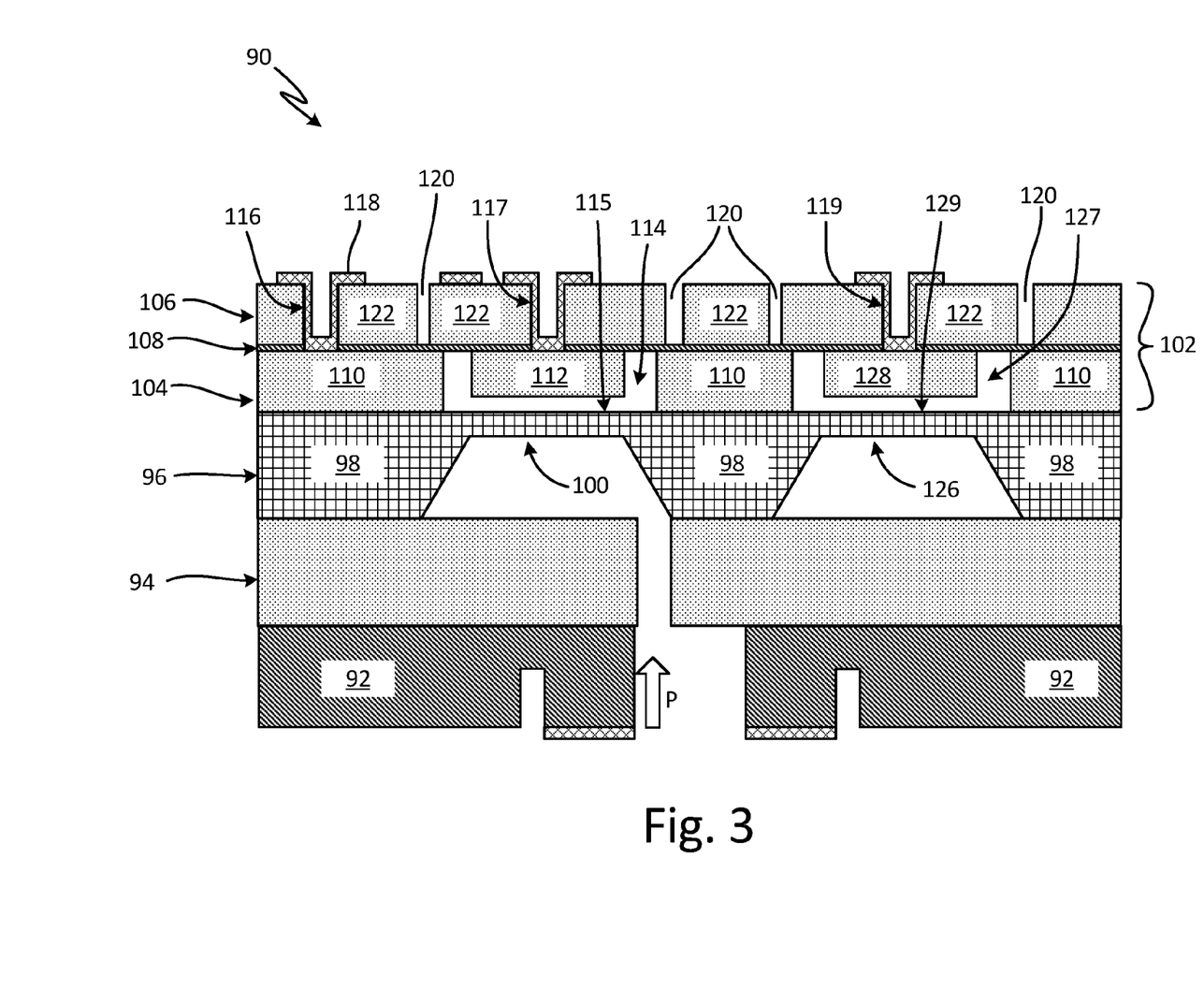
FIG. 3 is a schematic diagram of an all silicon capacitive pressure sensor with a reference node.

FIG. 3 is a schematic diagram of all silicon capacitive pressure sensor 90 with a reference node. Pressure sensor 90 is similar to pressure sensor 50 in FIG. 2, but contains a second node used as a reference. Pressure sensor 90 includes base wafer 92, backing wafer 94, sensing wafer 96, and electrode assembly 102. Electrode assembly 102, which is still a silicon on insulator electrode, contains first layer 104, second layer 106, and dielectric layer 108. First layer 104 contains structural portions 110, sensing node 112, and reference node 128. Second layer 106 contains structural portions 122, electrical contacts 116, 117, 119, and isolation gaps 120.

Base wafer 92 and backing wafer 94 are similar to base wafer 52 and backing wafer 54 in FIG. 2, function in the same way, and are attached in the same manner. Sensing wafer 96, which is still made of silicon, contains support portions 98, sensing diaphragm 100, and reference diaphragm 126. Sensing wafer 96 is bonded to backing wafer 94. Sensing diaphragm 100 is open to the external environment through passages in base wafer 92 and backing wafer 94, and still deflects based on the pressure of the fluid of interest. Sensing diaphragm 100 is aligned with sensing node 112 of electrode assembly 102 across gap 115. Deflection of diaphragm 100 changes capacitance across gap 115 and allows node 112 to detect the change.

Reference diaphragm 126 does not deflect. Reference diaphragm 126 is aligned with reference node 128 of electrode assembly 102. Reference diaphragm 126 is separated from reference node 128 by gap 129. Gap 129 serves as a point of reference for pressure detected at gap 115 between diaphragm 100 and node 112.

Electrode assembly 102 is similar to electrode assembly 62 in FIG. 2, with the addition of reference node 128 in first layer 104, and corresponding electrical contacts in second layer 106. First layer 104 contains structural portions 110, sensing node 112, and reference node 128. Second layer 106 contains structural portions 122, electrical contacts 116, 117, 119, and isolation gaps 120. First side 104 is separated from second layer 106 by dielectric layer 108 (typically an oxide or other insulator).

Like FIG. 2, sensing node 112 is electrically isolated from structural portions 110 and sensing wafer 96 by separation areas 114 and gap 115. Sensing node 112 is also electrically isolated from second layer 106 by dielectric layer 108. Similarly, reference node 128 is electrically isolated from structural portions 110 and sensing wafer 96 by separations areas 127 and gap 129. Reference node 128 is also electrically isolated from second layer 106 by dielectric layer 108.

Second layer 106 contains one or more electrical contacts 116, which are plated with a metal 118. Electrical contacts 116, 117, 119 are isolated from each other by isolation gaps 120 and from other parts of electrode assembly 102 by dielectric layer 108. Electrical contacts 116, 117, 119 run through dielectric layer 108 at certain areas to create electrical connections to sensing wafer 96, sensing node 112, or reference node 128. Electrical contacts 116, 117, 119 can be connected to external electronics (not pictured). In this set up, reference node 126 allows a point of reference for capacitance from sensing node 100.

Figure 4:
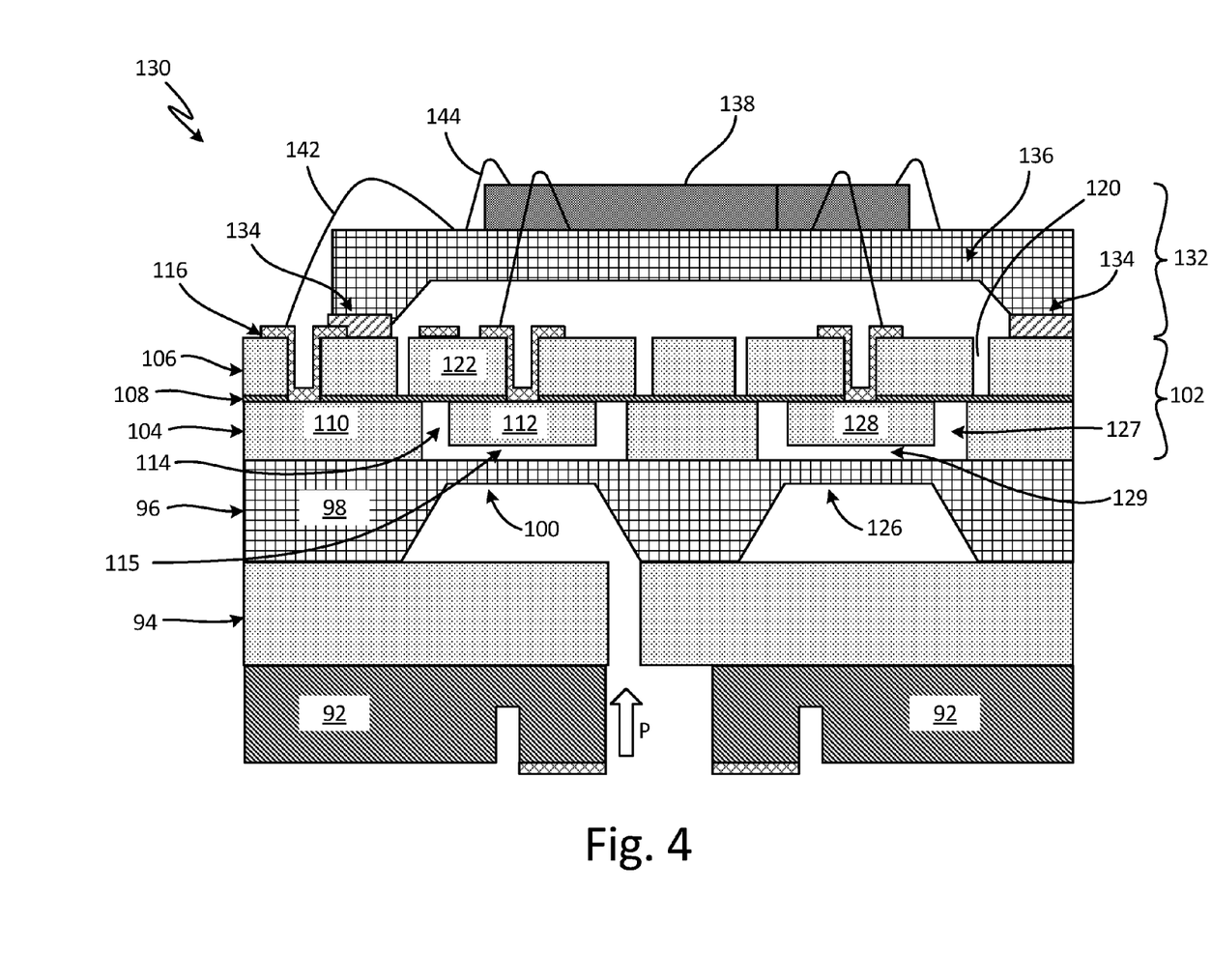
FIG. 4 is a schematic diagram of an all silicon capacitive pressure sensor with integrated electronics.

FIG. 4 is a schematic diagram of all silicon capacitive pressure sensor 130 with integrated electronics. Pressure sensor 130 is similar to pressure sensor 90 of FIG. 3, and has many of the same components, connected in the same manner, except where otherwise noted. FIG. 4 adds topping wafer assembly 132 to electrode assembly 102 opposite sensing wafer 96. Topping wafer assembly includes bonds 134, topping wafer 136, integrated circuit (IC) components 138, and wire bonds 142, 144.

Topping wafer 136 is bonded to electrode assembly 102 through bonds 134. Topping wafer 136 is typically made of silicon. Bonds 134 are structural and electrically insulating. IC components 138 are bonded to topping wafer 136. IC components 138 are electrically connected to electrical contacts 116, 117 and 119 via wire bonds 142, 144. IC components 138 receive electrical signals from electrical contacts 116 and amplify the signals until the signals are useable. IC components 138 can then send signals to external electronics (not pictured).

Figure 5:
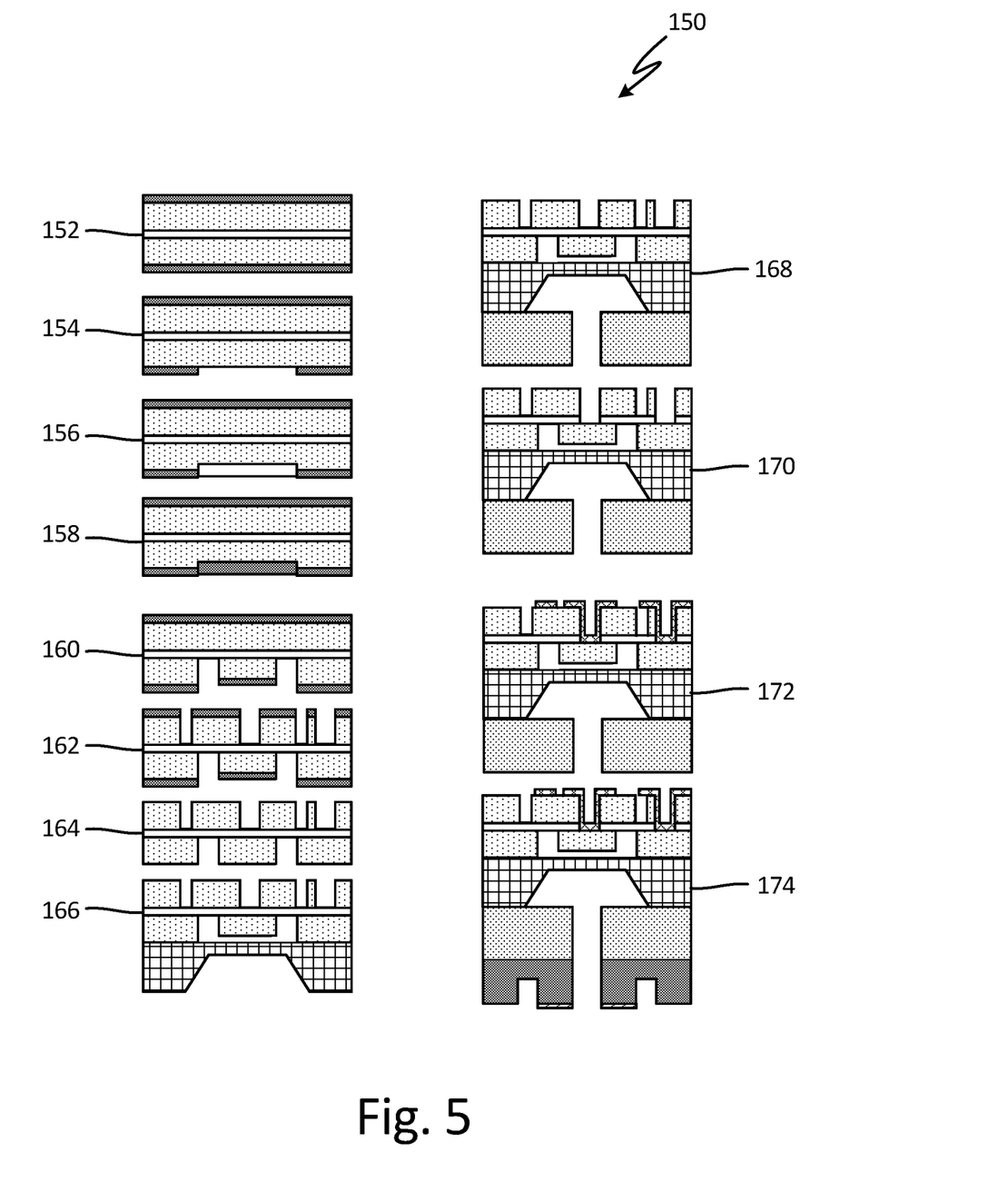
FIG. 5 is a schematic diagram of a method of making an all silicon capacitive pressure sensor.

FIG. 5 is a schematic diagram of method 150 of making an all silicon capacitive pressure sensor. Method 150 begins with depositing a nitride protection layer on a silicon on insulator (SOI) wafer in steps 152 to 158. Depositing a nitride protection layer begins with step 152 where low pressure chemical vapor deposition is performed, creating a nitride layer on the external surfaces of the SOI wafer.

Next, in step 154, a portion on a first side of the SOI wafer is patterned and a portion of the nitride layer is etched. Following this, in step 156, local oxidation of silicon etches a shallow cavity in the portion of the SOI wafer that was previously patterned and etched. In step 158, the resulting oxide is stripped, and a nitride layer is deposited to protect the etched surface.

After deposition of a nitride protection layer, cavities are etched into the wafer in steps 160 to 162. First, in step 160, deep reactive ion etching is used to create cavities on the first side of the SOI wafer around the portion that was previously protected with a nitride layer, resulting in a node isolated by surrounding negative areas. Next, in step 162, multiple cavities are etched on a second side of the SOI wafer (opposite the first side), using deep reactive ion etching. In this process, two types of cavities are etched: primary cavities and secondary cavities. After etching, the nitride protection layer is selectively removed (or "stripped") in step 164.

Next, the SOI wafer is bonded to a series of wafers that will make up the pressure sensor as a whole in steps 166 to 168. First is a sensing wafer, made of silicon. The sensing wafer is vacuum fusion bonded to the SOI wafer on the first side of the SOI wafer in step 166. Next, in step 168, a backing wafer, also made of silicon, is vacuum fusion bonded to the sensing wafer opposite the SOI wafer. The fusion bonds are then annealed to strengthen the bonds.

After the sensing wafer and backing wafer are attached, oxide is selectively removed from the assembly in step 170. After the removal of oxide, in step 172, metal is deposited in the primary cavities previously etched in the second side (opposite the sensing wafer) of the SOI wafer. Metal can be deposited through a shadow mask or via a lift off photolithography technique.

Finally, in step 174, a glass base wafer is bonded to the backing wafer opposite the sensing wafer. Metal can be deposited onto the base wafer opposite the backing wafer for future attachment of the assembly to other packaging. The electrically isolated sensing node created in the SOI wafer and the electrical connection system allow for low parasitic capacitance and minimal thermal mismatch.

The proposed capacitive pressure sensor is a low cost alternative to previous versions. The internal vacuum on this design removes the need for expensive vacuum packaging. Additionally, the proposed capacitive pressure sensor has high performance and low parasitic capacitance. The substrate materials in this pressure sensor are thermally matched to avoid thermal stress caused by thermal mismatch. There is no creep of electrode material, nor is there any hysteresis associated with traditional insulator electrodes. Moreover, the reduced bond area between electrodes and recessed electrode regions reduces parasitic capacitance to less than 10% of base capacitance, resulting in more accurate pressure readings. Finally, this pressure sensor has high material stability, as silicon is a highly stable crystalline material that is easily obtained at high purities.

Discussion of Possible Embodiments

The following are non-exclusive descriptions of possible embodiments of the present invention.

A capacitive pressure sensor includes a backing wafer; a sensing wafer comprising: a support portion bonded to the backing wafer, and a sensing portion, the sensing portion configured to detect pressure; an electrode assembly comprising: a first silicon layer comprising: an attachment portion bonded to the sensing wafer; and a sensing node, the sensing node centered over the sensing portion of the sensing wafer, wherein the sensing node is isolated from the sensing portion of the sensing wafer by a gap, and wherein the sensing node is isolated from the attachment portion of the first silicon layer by a separation area; an insulating layer bonded to the first silicon layer opposite the sensing wafer; and a second silicon layer bonded to the insulating layer opposite the first silicon layer, the second silicon layer comprising: a first electrical contact electrically connected with the sensing wafer; and a second electrical contact electrically connected with the sensing node.

The pressure sensor of the preceding paragraph can optionally include, additionally and/or alternatively, any one or more of the following features, configurations and/or additional components:

The pressure sensor includes a base wafer bonded to the backing wafer opposite the sensing wafer.

The first electrical contact passes through the insulating layer and connects to the first silicon layer.

The second electrical contact passes through the insulating layer and connects to the sensing node of the first silicon layer.

The pressure sensor includes a reference sensing portion in the sensing wafer; a reference node in the first silicon wafer; a gap between the reference sensing portion and the reference node; and a third electrical connection electrically connected to the reference node.

The pressure sensor includes at least one isolation slot in the second silicon layer, the isolation slot configured to electrically isolate the first electrical contact from the second electrical contact.

The insulating layer is in direct contact with the separation area.

The pressure sensor includes a topping wafer bonded to the second silicon layer opposite the insulating layer.

The pressure sensor includes one or more integrated circuit components bonded to the topping wafer opposite the second silicon layer.

The second silicon layer further comprises a structural portion, the first electrical contact embedded in the structural portion.

The pressure sensor includes a bond area between the attachment portion of the first silicon layer and the structural portion, the bond area being no greater than ten times the length of the gap between the sensing node and the sensing wafer.

The volume of the separation area is substantially larger than the volume of the gap.

The volume of the isolation slot is substantially larger than the volume of the gap.

The gap and the separation area contain a vacuum.

A method of making a capacitive pressure sensor includes depositing a nitride layer on a silicon on insulator wafer; etching a sensing node on a first side of the silicon on insulator wafer; etching primary and secondary cavities on a second side of the silicon on insulator wafer opposite the first side; selectively removing the protective nitride layer; bonding a sensing wafer to the first side of the silicon on insulator wafer opposite the second side; bonding a backing wafer to the sensing wafer opposite the silicon on insulator wafer; and depositing metal onto the primary cavities.

The method of the preceding paragraph can optionally include, additionally and/or alternatively, any one or more of the following features, configurations and/or additional components:

Depositing a nitride layer on the silicon on insulator wafer comprises: depositing a first nitride layer on the silicon on insulator wafer; etching a portion of the first nitride layer on the first side of the silicon on insulator wafer; oxidizing the silicon on insulator wafer; stripping an oxide from a portion of the surface of the silicon on insulator wafer; and depositing a second nitride layer on the first portion.

The method includes patterning the first nitride layer before etching a first portion of the first nitride layer.

The method includes selectively removing an oxide before depositing metal onto the primary cavities.

The primary cavities are configured to receive electrical connection.

The secondary cavities are configured to isolate electrical connections.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A capacitive pressure sensor comprising:
   a backing wafer;
   a sensing wafer comprising:
      a support portion bonded to the backing wafer, and
      a sensing portion, the sensing portion configured to detect pressure; and
   an electrode assembly comprising:
      a first silicon layer comprising:
         an attachment portion bonded to the sensing wafer; and
         a sensing node, the sensing node centered over the sensing portion of the sensing wafer, wherein the sensing node is isolated from the sensing portion of the sensing wafer by a gap, and wherein the sensing node is isolated from the attachment portion of the first silicon layer by a separation area;

an insulating layer bonded to the first silicon layer opposite the sensing wafer; and a second silicon layer bonded to the insulating layer opposite the first silicon layer, the second silicon layer comprising:

a first electrical contact electrically connected with the sensing wafer; and a second electrical contact electrically connected with the sensing node.

2. The pressure sensor of claim 1, further comprising a base wafer bonded to the backing wafer opposite the sensing wafer.

3. The pressure sensor of claim 1, wherein the first electrical contact passes through the insulating layer and connects to the first silicon layer.

4. The pressure sensor of claim 1, wherein the second electrical contact passes through the insulating layer and connects to the sensing node of the first silicon layer.

5. The pressure sensor of claim 1, further comprising:
a reference sensing portion in the sensing wafer;
a reference node in the first silicon wafer;
a gap between the reference sensing portion and the reference node; and
a third electrical connection electrically connected to the reference node.

6. The pressure sensor of claim 1, further comprising at least one isolation slot in the second silicon layer, the isolation slot configured to electrically isolate the first electrical contact from the second electrical contact.

7. The pressure sensor of claim 1, wherein the insulating layer is in direct contact with the separation area.

8. The pressure sensor of claim 1, further comprising a topping wafer bonded to the second silicon layer opposite the insulating layer.

9. The pressure sensor of claim 8, further comprising one or more integrated circuit components bonded to the topping wafer opposite the second silicon layer.

10. The pressure sensor of claim 1, wherein the second silicon layer further comprises a structural portion, the first electrical contact embedded in the structural portion.

11. The pressure sensor of claim 10, further comprising a bond area between the attachment portion of the first silicon layer and the structural portion, the bond area being no greater than ten times the length of the gap between the sensing node and the sensing wafer.

12. The pressure sensor of claim 1, wherein the volume of the separation area is substantially larger than the volume of the gap.

13. The pressure sensor of claim 6, wherein the volume of the isolation slot is substantially larger than the volume of the gap.

14. The pressure sensor of claim 1, wherein the gap and the separation area contain a vacuum.

15. A method of making a capacitive pressure sensor comprising:
depositing a nitride layer on a silicon on insulator wafer;
etching a sensing node on a first side of the silicon on insulator wafer;
etching primary and secondary cavities on a second side of the silicon on insulator wafer opposite the first side;
selectively removing the protective nitride layer;
bonding a sensing wafer to the first side of the silicon on insulator wafer opposite the second side;
bonding a backing wafer to the sensing wafer opposite the silicon on insulator wafer; and
depositing metal onto the primary cavities.

16. The method of claim 10, wherein depositing a nitride layer on the silicon on insulator wafer comprises:
depositing a first nitride layer on the silicon on insulator wafer;
etching a portion of the first nitride layer on the first side of the silicon on insulator wafer;
oxidizing the silicon on insulator wafer;
stripping an oxide from a portion of the surface of the silicon on insulator wafer; and
depositing a second nitride layer on the first portion.

17. The method of claim 16, further comprising patterning the first nitride layer before etching a first portion of the first nitride layer.

18. The method of claim 16, further comprising selectively removing an oxide before depositing metal onto the primary cavities.

19. The method of claim 16, wherein the primary cavities are configured to receive electrical connection.

20. The method of claim 16, wherein the secondary cavities are configured to isolate electrical connections.

* * * * *

UNITED STATES PATENT AND TRADEMARK OFFICE
CERTIFICATE OF CORRECTION

| | | |
|---|---|---|
| PATENT NO. | : 9,783,411 B1 | Page 1 of 1 |
| APPLICATION NO. | : 15/349607 | |
| DATED | : October 10, 2017 | |
| INVENTOR(S) | : David P. Potasek and Sean Houlihan | |

It is certified that error appears in the above-identified patent and that said Letters Patent is hereby corrected as shown below:

In the Specification

Column 1, Line 32:
Delete "SOT"
Insert --SOI--

Signed and Sealed this
Fifth Day of December, 2017

Joseph Matal
*Performing the Functions and Duties of the*
*Under Secretary of Commerce for Intellectual Property and*
*Director of the United States Patent and Trademark Office*